United States Patent [19]

Fang

[11] Patent Number: 5,369,053
[45] Date of Patent: Nov. 29, 1994

[54] METHOD FOR PATTERNING ALUMINUM METALLIZATIONS

[75] Inventor: Leuh Fang, Santa Clara, Calif.

[73] Assignee: Hewlett-Packard Company, Palo Alto, Calif.

[21] Appl. No.: 667,250

[22] Filed: Mar. 8, 1991

Related U.S. Application Data

[63] Continuation of Ser. No. 426,124, Oct. 24, 1989, abandoned.

[51] Int. Cl.⁵ .................. H01L 21/44; H01L 21/48
[52] U.S. Cl. .................................................. 437/194
[58] Field of Search ............... 437/194, 195, 225, 228

[56] References Cited

U.S. PATENT DOCUMENTS

| | | |
|---|---|---|
| 3,419,761 | 12/1968 | Pennebaker . |
| 3,477,886 | 11/1969 | Ehlenberger . |
| 3,917,495 | 11/1975 | Horn . |
| 4,087,314 | 5/1978 | George et al. ............... 437/194 |
| 4,203,800 | 5/1980 | Kitcher et al. ............... 156/664 |
| 4,256,534 | 3/1981 | Levinstein et al. ............... 156/643 |
| 4,272,308 | 6/1981 | Varshney . |
| 4,350,563 | 10/1982 | Takada et al. ............... 156/643 |
| 4,394,406 | 7/1983 | Gardiner et al. . |
| 4,397,724 | 8/1983 | Moran ............... 156/643 |
| 4,398,992 | 8/1983 | Fang et al. . |
| 4,416,952 | 11/1983 | Nishizawa et al. . |
| 4,444,618 | 4/1984 | Saia et al. ............... 156/643 |
| 4,462,846 | 7/1984 | Varshney . |
| 4,533,429 | 8/1985 | Josquin . |
| 4,577,394 | 3/1986 | Peel . |
| 4,631,806 | 12/1986 | Poppert et al. ............... 437/203 |
| 4,639,277 | 1/1987 | Hawkins . |
| 4,680,087 | 7/1987 | Bobbio . |
| 4,717,631 | 1/1988 | Kaganowicz et al. . |
| 4,725,560 | 2/1988 | Abernathey et al. . |
| 4,729,816 | 3/1988 | Nguyen et al. . |
| 4,838,992 | 6/1989 | Abraham ............... 156/665 |

FOREIGN PATENT DOCUMENTS

| | | |
|---|---|---|
| 56-001538 | 1/1981 | Japan . |
| 56-122143 | 10/1981 | Japan . |
| 58-162049 | 10/1983 | Japan . |
| 59-025245 | 2/1984 | Japan . |
| 60-033367 | 2/1985 | Japan . |

OTHER PUBLICATIONS

Translation of Irir Masahira (Iiri) et al. JP 56-122142.
S. Wolf and R. Tauber, *Silicon Processing for the VLSI Era*, Lattice Press, Sunset Beach (1986) pp. 555–556.
Abstract from INSPEC database of Mak et al., "Photo-patterning and Dry Etching of Al and Al alloy for VLSI CMOS Process" Proc. of the 6th Biennial Univ./Gov./Indus. Microelectronics Symposium, Jun. 1985 pp. 22–27.

*Primary Examiner*—Brian E. Hearn
*Assistant Examiner*—Lynn A. Gurley

[57] ABSTRACT

A process for the fine replication of aluminum-based metallizations on semiconductor devices. A layer of material, such as silicon dioxide or oxynitride, that is resistant to the chlorine-based etchants that readily attack aluminum and aluminum alloys is deposited upon an aluminum-based metallization layer. A relatively thin layer of photoresist is deposited thereover and developed. Etchant gases attack the dielectric layer, creating a patterned hard mask for subsequent etching of the underlying metal.

18 Claims, 2 Drawing Sheets

METHOD FOR PATTERNING ALUMINUM METALLIZATIONS

This is a continuation of copending application Ser. No. 07/426,124 filed on Oct. 24, 1989, now abandoned.

BACKGROUND

1. Field of the Invention

The present invention relates to apparatus and methods for use in patterning the metallization of a semiconductor device. More particularly, this invention pertains to the utilization of a "hard" mask for patterning of metallizations that include aluminum alloys.

2. Description of the Prior Art

Semiconductor devices generally require a network of metallizations at their upper surfaces that serve as gates and interconnecting conductors for device control, activation and output. For example, in a so-called charge coupled device (CCD) conductive metallizations provide means for "reading out" charge accumulated in localized regions of the device as a consequence and measure of incident radiation. The arrangement or "patterning" of metallizations must be extremely accurate. This is especially true in the case of VLSI (very large scale integration) devices that may possess densities in excess of $10^5$ transistors per chip.

In addition to accuracy of location, the optimum operation of such devices requires metallizations of consistent line widths and the absence of "undercutting". The former is exceedingly difficult to attain in the fabrication of VLSI devices that commonly require gate widths of less than two (2) microns. An extremely small deviation from nominal width may result in significant and undesired localized effects. The latter characteristic can introduce deleterious stray capacitances that produce device and system failures.

The "standard" metal for use in present day devices is aluminum. This metal and its selected alloys possess the lowest resistivity of all materials that have been found to be practical. That is, the selected aluminum-based alloys have proven to be amenable to commercial etching and like processes.

In the past, patterning has generally been accomplished by etching processes in which a layer of metallization is deposited upon a semiconductor substrate. A layer of photoresist is then deposited atop the metallization and photolithographically developed and removed by means of an acetate bath or the like. Thereafter a (liquid or gaseous) etchant is introduced that attacks the exposed portions of metallization, leaving the desired pattern atop the substrate.

A relatively long time is required to etch the metallization, since a relatively thick layer of photoresist must be employed to protect the pattern throughout etching since present-day etchants are highly corrosive and will tend to dissolve the photoresist that remains to protect the underlying metallization causing corrosion of the underlying metallization. For example, a 1.5 micron (15,000 Angstrom) thick layer of photoresist is normally required to protect a 7,000 Angstroms thick layer of metallization during etching. The photoresist traps highly corrosive etchant (solution or gas) ions. Therefore, while a thick layer of photoresist protects the metallization, the very thickness of the layer materially increases the risk of corrosion after the pattern has been formed. Further, the thicker the layer of photoresist, the greater the difficulty of maintaining a very narrow physical aperture for etching a correspondingly-narrow line of metallization.

SUMMARY OF THE INVENTION

The present invention addresses the preceding shortcomings of the prior art by providing a novel process of forming a preselected pattern of aluminum-based metallizations on a semiconductor device of the type that includes a substrate of semiconductor material. This process includes the deposition of a layer of aluminum-based metallization on comprising alloy of copper and aluminum on the substrate. A layer of Tiw is deposited at the top of the metallization. Thereafter, a layer of material that is resistant to chlorine-based etchants is deposited. A layer of photoresist is then deposited, developed and regions thereof removed in accordance with a predetermined pattern to thereby expose predetermined regions of the layer of resistant material. A fluorine-based etchant is then applied to the exposed regions of the layer of resistant material to create a hard mask having a predetermined pattern of apertures for exposing predetermined underlying regions of the Tiw The fluorine-based etchant is continued to be applied to etch the exposed regions of the TiW layer. Thereafter, a chlorine-based etchant is applied until the exposed regions of the metallization layer are removed to form a preselected pattern of metallizations on the substrate.

The foregoing and additional features of this invention will become further apparent from the detailed description that follows. This written description is accompanied by a set of drawing figures. Numerals of the drawing figures, corresponding to those of the written description, point to the various features of the invention, like numerals referring to like features throughout.

DETAILED DESCRIPTION

Figure 1:
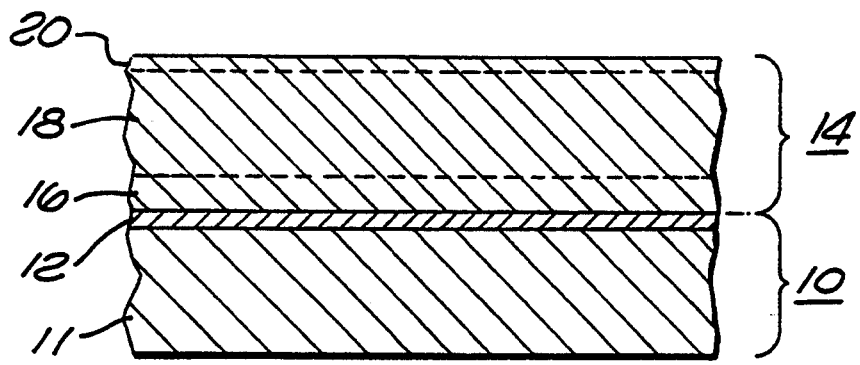
FIGS. 1 through 6 present a sequential illustration of the process steps of the invention for forming a predetermined pattern of metallizations on a semiconductor device.

Turning now to the drawings, FIG. 1 is an elevation view in cross-section of a semiconductor wafer 10 with an overlying layer of metallization 14 that is to be patterned in accordance with the process of the invention. The layer 14, when appropriately patterned, provides a network of conductors for communicating with various input, output and control devices (e.g. gates) to thereby effect and measure the operation of the resultant semiconductor device. Various diffusions (not shown) within the substrate 10 will, to a large extent, dictate the proper geometry of the network of conductors.

The wafer 10 preferably comprises a substrate 11 of single crystalline silicon and an overlying oxide layer 12. The oxide layer 12, which provides passivation, may be grown atop the silicon 11 in a high temperature epitaxial growth process or may be deposited by low pressure chemical vapor deposition (LPCVD) or like conventional process.

The metallization 14 preferably comprises three distinct sub-layers, each of which is suitably sputter deposited. A lower barrier layer 16 is interposed for preventing interdiffusion of the aluminum atoms within the main conducting middle layer 18 (discussed below) and the silicon atoms of the substrate 10. An appropriate layer 16 can be formed of titungsten (an alloy of titanium and tungsten also known as TiW) composition. TiW generally comprises about 12.5 per cent titanium and 87.5 per cent tungsten and is suitably deposited to a depth of about 1500 Angstroms.

The middle layer 18 may be an aluminum-copper (about 4 per cent copper) alloy that serves as the main conductor of the metallization pattern. An appropriate thickness of this portion of the metallization 14 to facilitate conduction is approximately 5000 Angstroms.

A top layer 20 comprises a TiW film of about 500 Angstroms in thickness. Such a top layer acts to suppress the formation of undesired "hillocks" during patterning. Additionally, the top layer 20 reduces the reflectivity of the underlying aluminum alloy and thereby facilitates patterning.

Figure 2:
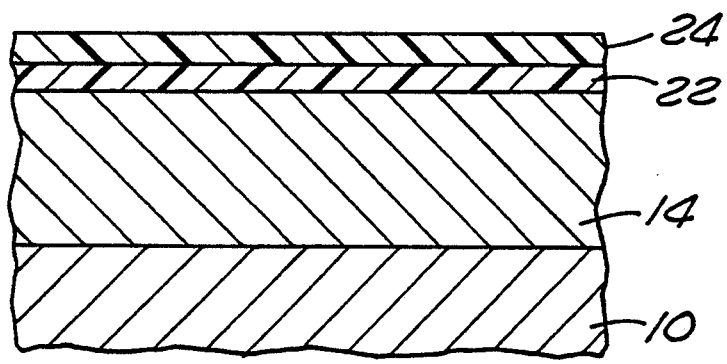

FIG. 2 is an elevation view in cross-section of the workpiece after subsequent formation steps during which (1) a layer 22 of material that will act as a hard mask and (2) an overlying layer 24 of photoresist have been formed. The hard mask dielectric layer 22 is preferably of either silicon dioxide or oxynitride composition and has a thickness of about 3500 Angstroms. The material of the hard mask is chosen for compatibility with the main portion of the underlying layer of metallization 14. That is, the composition of the layer 22 is chosen for resistance to the preferred etchant of the aluminum-based layer 14. Generally, a chlorine-based gaseous etchant such as chlorine or boron trichloride serves to etch an aluminum based alloy both accurately and relatively rapidly and each of the above-named dielectric materials is quite resistant thereto. The photoresist 24 may be spun deposited to a depth of only 5000 Angstroms, significantly thinner than photoresist layers employed for similar purposes in the prior art.

As mentioned earlier, the top 20 of the metallization 14 preferably includes a non-aluminum based alloy such as TiW which may not be readily etched by a chlorine-based etchant. This particular material is more readily etched with a fluorine-based etchant such as carbon tetrafluoride or the compound that is more commonly known by the trademark "FREON". Unlike chlorine-based etchants, the identified materials of the hard masking layer 22 are also quite subject to (relatively slow) etching by such fluorine-based compounds. As will be described below, this factor, which may arise from a desire to enhance the resultant conductors (i.e. by minimizing reflectivity, removing hillocks, etc.) is accounted for in the processing of the pattern of metallizations.

Figure 3:
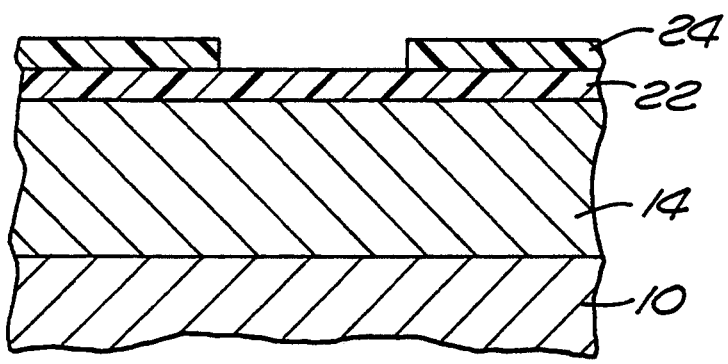

FIG. 3 is a cross-sectional elevation view of the structure after photolithographic development and removal of predetermined regions of the layer of photoresist 24 in an acetone bath or like process. Unlike the prior art, the layer of photoresist 24 is patterned only as a precursor to etching the hard mask layer 22. As will be seen, the formation of a hard mask of appropriate composition enables one to reduce the thickness of the photoresist layer 24 to a significant extent, the attendant advantages thereof being apparent from the discussion of the prior art above.

Figure 4:
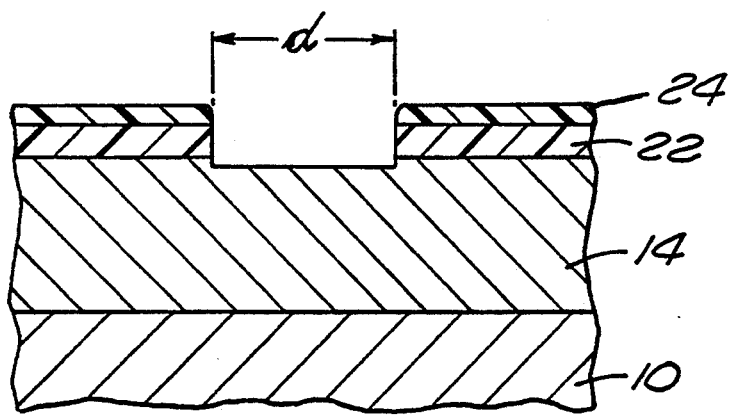

FIG. 4 is a cross-sectional view that discloses the effect of the introduction of a controlled atmosphere including an appropriate etchant. As can be seen, the patterned photoresist 24 defines an aperture of preselected width d. After the introduction of the etchant gas, the exposed region of the hard mask layer 22 underlying the aperture in the photoresist 24 is attacked. As mentioned above, this layer is attacked by a fluorine-based etchant, as is the TiW film at the upper surface of the metallization 14, leaving a depression of approximately 500 Angstroms or less in the top of the metallization. As can be seen, the depth of the photoresist layer 24 is also thinned by continuing exposure to the etchant gases.

The depth of the upper TiW treatment layer 20 is only a small fraction of that of the middle layer 18 that provides the main conductor of the metallization 14. After this layer has been partially etched by the flourine-based etchant as shown in FIG. 4, a chlorine-based etchant is used for the purpose of continuing the etching of the metallization 14 through the aluminum-based main conductor layer. The chlorine-based etch is continued through the aluminum-copper middle layer 18 eventually producing the structure of FIG. 5. As mentioned earlier, the composition of the hard mask layer 22 is chosen for resistance to the chlorine etchants that readily attack aluminum-based alloys.

Figure 5:
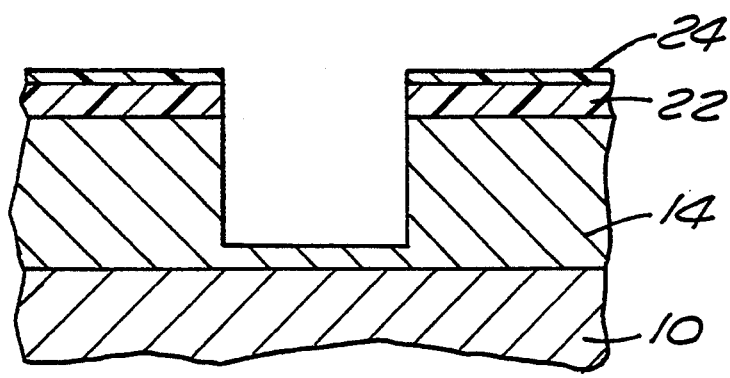
Figure 6:
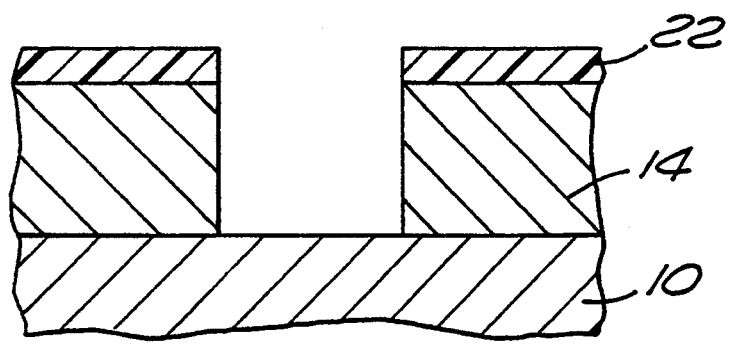

As is shown in FIGS. 4 and 5, the layer of photoresist 24 is continuously attacked by (both) etchant gases throughout the process. Gradually the layer 24 is reduced to a minimal depth at the time that the removal of the predetermined region of the middle layer 18 of the metallization followed by removal of the TiW barrier layer 16 by means of a further fluorine-based etching step has been completed as shown in FIG. 5. The apparatus as shown in this figure may then be removed from the etchant atmosphere, rinsed to remove the remaining photoresist and baked until dry. The etched hard mask layer 22 remains for passivation of the underlying pattern of metallization as shown in FIG. 6.

The process of the invention relies in large measure upon the relative resistance of the dielectric hard mask material to commonly employed aluminum etchants. The oxide materials discussed above are, in fact, subject to etching by chlorine-based etchants. Hence the term "etch resistant" is qualified. This refers to the fact that a significantly greater amount of time is required to etch the preferred materials by means of such a chlorine-based etchant than is required to etch a layer of conventional photoresist to the same extent or depth. The disparity is roughly on the order of four times. That is, it requires a chlorine-based etchant appropriate for etching an aluminum-based metallization approximately four times the length of exposure time to etch a layer of silicon dioxide or oxynitride to the same depth as is required to etch a conventional photoresist by the same amount. This quality permits the use of thinner masking layers, a smaller volume of etchant-absorbing photoresist and the other advantages that follow from the use of a thinner layer of photoresist.

As can be seen, the present invention provides an improved method for forming a preselected pattern of aluminum-based metallizations on a semiconductor device of the type that includes a substrate of semiconductor material. By utilizing the teachings of the invention one may reliably pattern the metallizations required for operation of a large variety of semiconductor devices, including those falling into the VLSI range, and avoid the degree of imperfection and risk of corrosion associated with prior art methods. While this invention has been described with reference to its presently preferred embodiment it is not limited thereto. Rather its scope is limited only insofar as defined by the following set of claims and includes all equivalents thereof.

What is claimed is:

1. A process for forming a preselected pattern of aluminum-based metallizations on a semiconductor device of the type that includes a substrate of semiconductor material comprising the steps of:
   a) depositing a layer of aluminum-based metallization comprising an alloy of copper and aluminum on said substrate; then
   b) depositing a layer of TiW at the top of said metallization; then
   c) depositing a layer of material resistant to chlorine-based etchants; then
   d) depositing a layer of photoresist on said resistant layer; then
   e) developing and removing regions of said layer of photoresist in accordance with said predetermined pattern to thereby expose predetermined regions of said layer of resistant material; then
   f) applying a fluorine-based etchant to said exposed regions of said layer of resistant material to thereby create a hard mask having a predetermined pattern of apertures for exposing predetermined, underlying regions of said TiW layer; then
   g) continuing to apply said fluorine-based etchant to etch said exposed regions of said TiW layer; then
   h) applying a chlorine-based etchant until said exposed regions of said layer of metallization are removed, whereby said preselected pattern of metallizations is formed on said semiconductor substrate; and
   i) utilizing the hard mask for passivation, of the underlying pattern of metallization, in subsequent semiconductor assembly.

2. A process as defined in claim 1 wherein said layer of material resistant to chlorine-based etchants is silicon dioxide.

3. A process as defined in claim 2 wherein said layer of silicon dioxide is deposited by low pressure chemical vapor deposition 4. A process as defined in claim 1 wherein said layer of material resistant to chlorine-based etchants is oxynitride.

5. A process as defined in claim 1 wherein said layer of oxynitride is deposited by plasma enhanced chemical vapor deposition.

6. A process as defined in claim 1 wherein said layer of oxnyitride is deposited by low pressure chemical vapor deposition.

7. A process as defined in claim 1 wherein said etchant is applied in a gaseous phase.

8. A process as defined in claim 1 including the additional steps of:
   a) positioning a layer of TiW at the bottom of said metallization; then
   b) applying a fluorine-based etchant to the exposed regions of said layer after the overlying metallization has been removed with a chlorine-based etchant.

9. A process as defined in claim 8 wherein said layer resistant to chlorine-based etchants is silicon dioxide.

10. A process as defined in claim 9 wherein said layer of silicon dioxide is deposited by low pressure chemical vapor deposition.

11. A process as defined in claim 10 wherein said layer resistant to chlorine-base etchants is oxynitride.

12. A process as defined in claim 11 wherein said layer of oxynitride is deposited by plasma enhanced chemical vapor deposition.

13. A process as defined in claim 11 wherein said layer of oxynitride is deposited by plasma enhanced chemical vapor deposition.

14. A process as defined in claim 1 further characterized in that:
   a) said layer of metallization is deposited to a depth of 7000 Angstroms; and
   b) said layer of photoresist is deposited to a depth of no more than 5000 Angstroms.

15. A process as defined in claim 14 further characterized in that said layer of material resistant to a chlorine-based etchant is deposited to a depth of 3500 Angstroms.

16. A process as defined in claim 1 wherein said alloy is a four percent copper-aluminum alloy.

17. A process as defined in claim 16 wherein said fluorine-based etchant is $CHF_3$.

18. A process as defined in claim 16 wherein said fluorine-based etchant is $CF_4$.

* * * * *